US 9,178,517 B2

(12) United States Patent
Agrawal

(10) Patent No.: US 9,178,517 B2
(45) Date of Patent: Nov. 3, 2015

(54) WIDE RANGE CORE SUPPLY COMPATIBLE LEVEL SHIFTER CIRCUIT

(71) Applicant: STMicroelectronics International N.V., Amsterdam (NL)

(72) Inventor: Ankit Agrawal, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/078,236

(22) Filed: Nov. 12, 2013

(65) Prior Publication Data

US 2015/0130528 A1    May 14, 2015

(51) Int. Cl.
| H03L 5/00 | (2006.01) |
| H03K 19/0185 | (2006.01) |
| H03K 19/00 | (2006.01) |
| H03K 19/017 | (2006.01) |

(52) U.S. Cl.
CPC ........ *H03K 19/0185* (2013.01); *H03K 19/0013* (2013.01); *H03K 19/017* (2013.01)

(58) Field of Classification Search
CPC ............... H03K 19/018521; H03K 3/356113; H03K 19/00315; H03K 17/102; H03K 3/012
USPC .................. 327/333; 326/68, 83, 81
See application file for complete search history.

(56) References Cited

U.S. PATENT DOCUMENTS

| 5,047,816 A | * | 9/1991 | Cuevas ......................... 257/366 |
| 6,548,870 B1 | * | 4/2003 | Lee .............................. 257/365 |
| 6,954,100 B2 | | 10/2005 | Dharne et al. |
| 6,963,226 B2 | | 11/2005 | Chiang |
| 7,385,436 B2 | * | 6/2008 | Itoh et al. ...................... 327/534 |
| 2007/0063758 A1 | * | 3/2007 | Allard et al. .................. 327/333 |
| 2010/0264492 A1 | | 10/2010 | Surdeanu et al. |

* cited by examiner

*Primary Examiner* — Quan Tra
(74) *Attorney, Agent, or Firm* — Seed IP Law Group PLLC

(57) ABSTRACT

A level shifter circuit is implemented with dual gate fully depleted silicon-on-insulator (FDSOI) technology. By enhancing the performance of the NMOS and devices within the level shifting circuit, the $V_t$ of the dual gate FDSOI NMOS transistors is lowered without a need for additional control circuitry. Lowering the $V_t$ can be accomplished through dynamic secondary gate control, by coupling together primary and secondary gates of the NMOS devices, while secondary gates of the PMOS devices can be coupled to a high voltage supply level. Such high performance NMOS devices can then operate at higher frequencies and run on a much wider range of core power supplies. Meanwhile, conventional DC conditions are maintained during steady state operation. Because no components are added to the level shifter circuit, the higher performance is achieved without an increase in size and current consumption.

14 Claims, 9 Drawing Sheets

WIDE RANGE CORE SUPPLY COMPATIBLE LEVEL SHIFTER CIRCUIT

BACKGROUND

1. Technical Field

The present disclosure generally relates to the design of integrated level shifter circuits that are operable at more than one power supply voltage.

2. Description of the Related Art

Some integrated circuits (ICs) are designed to operate at two different supply voltages—a first supply voltage for core functions, and a second supply voltage for interfacing functions. Typically, the second supply voltage is higher than the first supply voltage, because interface circuits normally operate at a higher voltage level than the core of the IC. A higher supply voltage level at the I/O pads is desirable to drive large electrical loads at optimum speed. A lower voltage supply level at the core enables use of advanced transistors that have thinner gate oxide. For such ICs to be used in, and to communicate with, external systems whose power supply voltages are higher, there is a need for voltage level matching by input-output (I/O) interface circuits within the IC. For such circuits that use at least two supply voltages, it is generally desirable for the core voltage supply to be shifted to a higher level to interface with external integrated circuits. A level shifter circuit can be used to translate the low voltage level signals to higher voltage level signals. Examples of existing level shifter circuits are disclosed in U.S. Pat. No. 6,954,100 to Dharne et al. and U.S. Pat. No. 6,963,226 to Chiang.

It has been observed that, when operating at lower core voltages, the core operating voltage may fail to exceed the threshold voltage, $V_t$, of metal-oxide-semiconductor (MOS) transistors, and as a result, the MOS devices do not turn on. In addition, at lower core voltages, if the MOS device does turn on, the transition from the off state to the on state occurs slowly, and thus the frequency of operation is reduced, or the device may even fail to function. In response to such problems, several level-shifting techniques were developed to reduce the $V_t$ of NMOS devices in particular, and to adjust their operation frequency as well as incorporating a lower core supply voltage. However, conventional solutions have relied on the introduction of additional control circuitry into the level shifting circuit, which tends to increase the footprint of the circuit on an IC chip.

BRIEF SUMMARY

The level shifter circuit disclosed herein is capable of reducing the threshold voltage of the MOS devices without introducing additional control circuitry. Instead, the level shifter circuit is redesigned so the transistors can sense a broader range of low supply voltages and can operate at a very high frequency. A preferred circuit design disclosed herein uses dual gate transistors implemented with fully depleted silicon-on-insulator (FDSOI) technology. Lowering the $V_t$ can be accomplished through dynamic secondary gate control in which a back-biasing technique is used to operate the dual-gate FDSOI NMOS transistors with enhanced switching performance. By coupling both primary and secondary gates of the dual-gate FDSOI NMOS devices together, the threshold voltage of the device is lowered during the transition from the off state to the on state, by enhancing the amount of charge required to form an inversion region in the channel of the transistor. Meanwhile, conventional DC conditions are maintained during steady state operation. Consequently, the MOS devices can operate at very low core voltage supply levels, down to as low as 0.4 V, which allows the transistors to respond quickly and to switch at higher speeds. Such high performance NMOS devices run on a much wider range of power supplies and can operate at higher frequencies. Because no components are added, the inventive level shifting circuits are more area efficient.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with NMOS and PMOS transistors and associated circuits have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Figure 1:
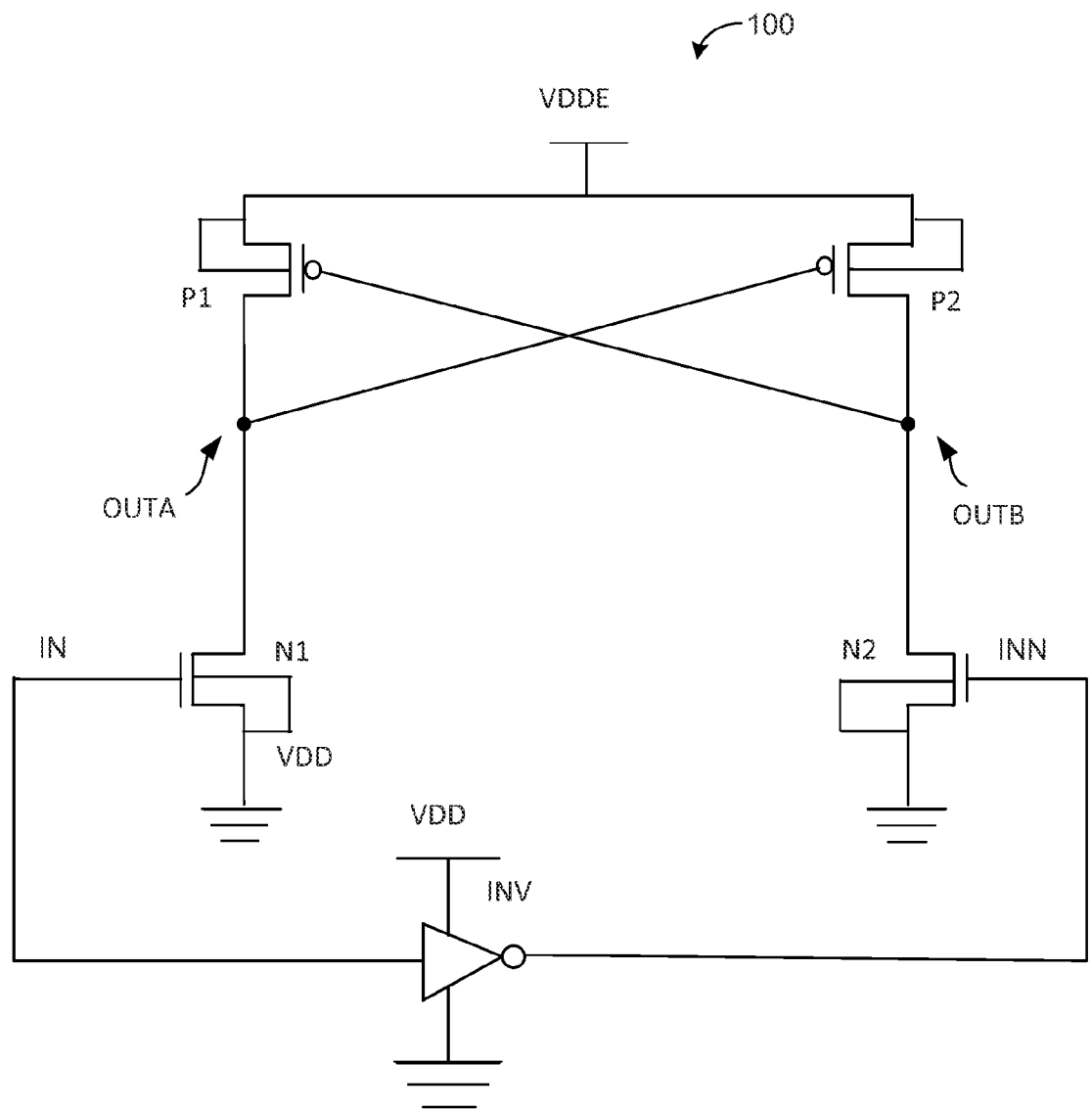
FIG. 1 is a schematic of a first prior art level shifter circuit.

FIG. 1 shows a first conventional level shifter circuit 100 that receives an input signal IN or INN at a low voltage level, $V_{DD}$, and generates an output signal OUTA or OUTB at a high voltage level, $V_{DDE}$. Thus, the level shifter circuit 100 shifts the voltage level from $V_{DD}$, suitable for core functions, to $V_{DDE}$, suitable for interface circuits. At current technology nodes, typical values of $V_{DD}$ are, for example, within the range of about 0.6 V-1.1 V, and $V_{DDE}$ typically is within the range of about 1.65 V-3.6 V.

The conventional level shifter circuit 100 includes two p-channel transistors P1, P2; two n-channel transistors N1, N2; and a standard low-voltage inverter, INV. Source and drain terminals of the transistor P1 are coupled between nodes $V_{DDE}$ and OUTA, respectively, so that when P1 is on, OUTA is at the higher voltage level $V_{DDE}$. The gate terminal of the transistor P1 is coupled to a node OUTB. Source and drain terminals of the transistor P2 are coupled between nodes $V_{DDE}$ and OUTB, respectively, such that when P2 is on, OUTB is at the higher voltage level $V_{DDE}$. The gate of the transistor P2 is coupled to the node OUTA. Source and drain terminals of the transistor N1 are coupled between nodes OUTA and ground, respectively, such that when N1 is on, it pulls the voltage at OUTA low, to 0 V. The gate of the transistor N1 is coupled to a low voltage input signal, IN. The transistor N2 is coupled between nodes OUTB and ground, respectively such that when N2 is on, it pulls the voltage at OUTB low, to 0 V. The gate of transistor N2 is coupled to receive a signal INN. The signal INN is generated by the low voltage inverter INV.

The transistors N1, N2, P1, and P2 are typically manufactured using a thicker gate oxide than is used in the transistors comprising the inverting device INV. Such a thicker oxide permits the transistors N1, N2, P1, and P2 to sustain the higher voltage level $V_{DDE}$, while the thinner oxide used in the inverting device INV is sufficient to sustain the lower voltage level $V_{DD}$.

The first conventional level shifter circuit 100 shown in FIG. 1 operates as follows: When the input signal IN is at logic low level, 0 V, the transistor N1 is off and N2 is on. The corresponding signal INN is high at $V_{DD}$ due to the inverting device INV. As a consequence, node OUTB is low, at 0 V, P1 is on, and node OUTA is high at $V_{DDE}$. When the input signal IN is high at $V_{DD}$, the transistor N1 is on and the transistor N2 is off. The corresponding signal INN is low due to the inverting device INV. As a consequence, node OUTA is low, transistor P2 is on, and OUTB is high at $V_{DD}$.

During steady state operation, the circuit of FIG. 1 is generally efficient and does not experience significant power loss. This is because, at steady state, the voltage levels have reached their low or high values, at 0 V, or $V_{DD}/V_{DDE}$, respectively, not at intermediate values. However, efficiency can be compromised during the time interval when the input signal IN undergoes a transition from a low to a high logic level, for instance, when the input signal IN rises from 0 V to $V_{DD}$. When IN is low, node OUTA is high at $V_{DDE}$ and OUTB is low. As the signal IN rises above the threshold voltage of transistor N1, N1 turns on, thereby trying to pull down node OUTA. But, at the same time, transistor P1 is also on. Thus, a contention appears between transistors N1 and P1 that causes the voltage at node OUTA to decrease slowly. Eventually, node OUTA falls sufficiently low to turn on transistor P2. At this point, both N2 and P2 are on. A contention appears between the transistors N2 and P2 that causes the voltage at node OUTA to rise slowly. As the signal INN transitions to a low state, transistor N2 turns off, thus allowing transistor P2 to pull up node OUTB. Eventually, the voltage at node OUTB rises high enough to turn off transistor P1, and allowing N1 to pull down OUTA to ground. At this point, transistor P2 turns fully on and the voltage at node OUTB rises to $V_{DDE}$.

In summary, during voltage transitions, contentions are produced in the conventional level shifter circuit 100, which cause switching delays at the outputs, and which consume power unnecessarily. Such contentions occur when N1 and P1 are simultaneously on, or when N2 and P2 are simultaneously on. Because the transistors N1 and N2 have thick gate oxide, and hence a higher threshold voltage, when the input signal IN is rising, the turn-on of transistor N1 is delayed, which, in turn, delays the transitions at nodes OUTA and OUTB. Moreover, if the threshold voltage of N1 is comparable to the lower supply voltage $V_{DD}$, then transistor N1 may not turn on strongly enough to pull down node OUTA quickly. Thus, the contention between N1 and P1 takes a long time to resolve, thereby slowing the transition at nodes OUTA and OUTB and consuming a large current. Faster transitions, therefore, are desirable in addressing the above problem that arises due to higher a threshold voltage associated with thicker oxide transistors N1 and N2.

Figure 2:
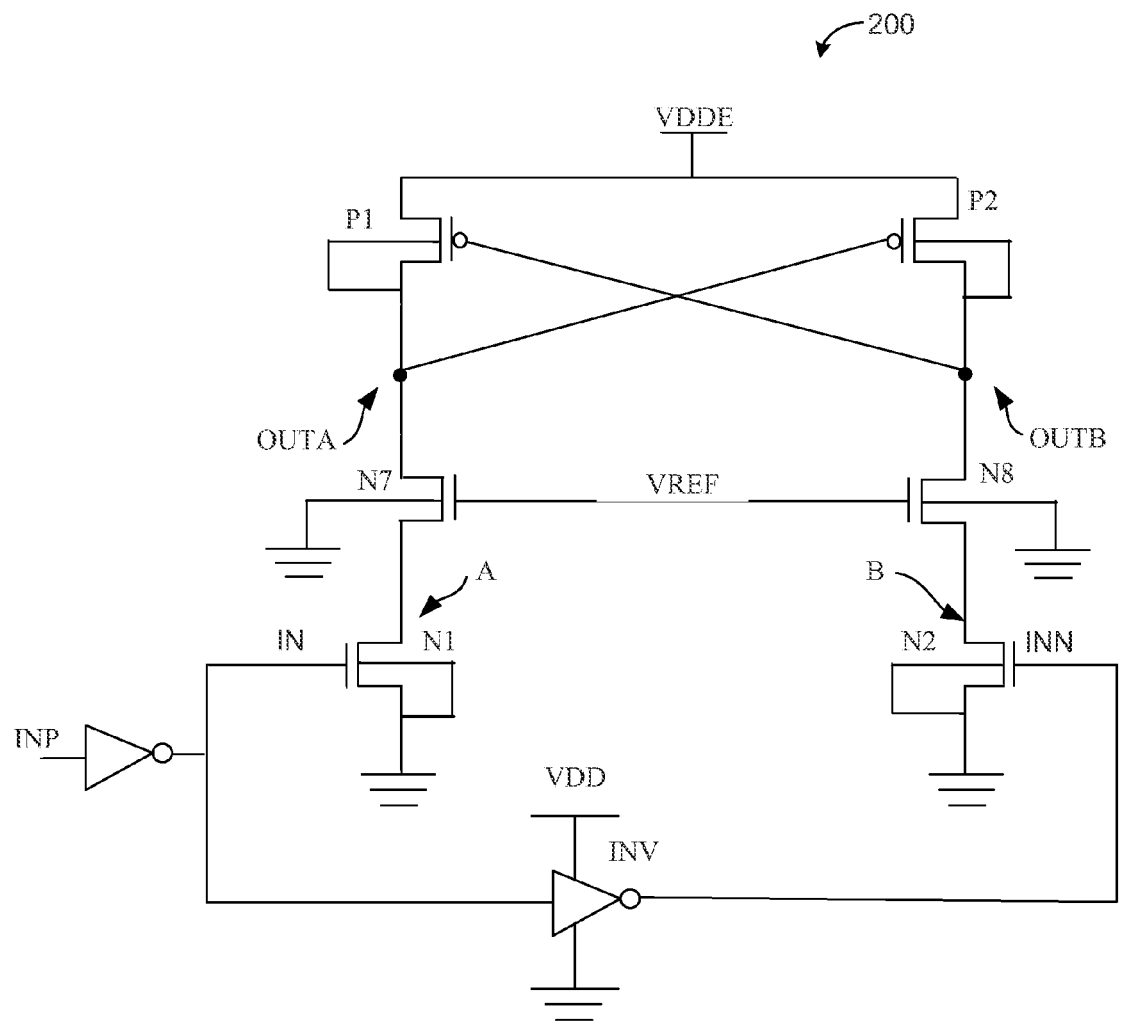
FIG. 2 is a schematic of a second prior art level shifter circuit, employing low threshold voltage transistors at the input.

A second conventional level shifter circuit 200 shown in FIG. 2 can be used, as described in U.S. Pat. No. 6,963,226. The second conventional level shifter circuit 200 is similar to the first conventional level shifter circuit 100 shown in FIG. 1. However, in the case of the circuit 200, the thick gate oxide transistors N1 and N2 are replaced by thin gate oxide transistors that can sustain the low voltage level $V_{DD}$. Also, additional control circuitry is introduced in the form of two NMOS transistors, N7 and N8. In particular, transistor N7 is coupled between transistor N1 and node OUTA, and transistor N8 is coupled between transistor N2 and node OUTB. The gates of both transistors N7 and N8 are coupled to a reference signal, $V_{ref}$. Both of the transistors N7 and N8 are thick gate oxide transistors that can sustain the higher voltage supply level $V_{DDE}$. $V_{ref}$ is a reference voltage signal which ensures that transistors N1 and N2 are not stressed by the higher voltage supply $V_{DDE}$. Such a reference voltage signal is approximately equal to the sum of $V_{DD}$ and the $V_t$ associated with a thick gate oxide transistor.

When the transistors N1 and N2 are implemented using thin gate oxide devices, they have a lower threshold voltage. Thus, if the input signal IN is rising, transistor N1 would turn on early, thus causing node A, and hence node OUTA, to fall faster, while allowing the circuit to function at even lower core supply voltage levels than the core supply voltage levels that are applicable to the level shifter 100. This turns on transistor P2 which pulls up node OUTB to turn off transistor P2. When P2 is on, regenerative feedback is activated, causing rapid transitions at nodes OUTA and OUTB. Thus, use of the thin gate oxide devices, in particular for the n-type transistors, results in overall speed increase in the operation of the level shifter circuit.

Despite this improvement, there still exists an inherent drawback in both of the conventional level shifter circuits 100 and 200 shown in FIGS. 1 and 2, respectively. Due to the lower range of core supply voltages, overdrive of the transistors N1 and N2 is reduced, which in turn limits their speed and potentially even their functionality at lower core supply voltage levels. Further, to cope with such a constraint, the sizes of the NMOS transistors are normally kept quite high.

Figure 3B:
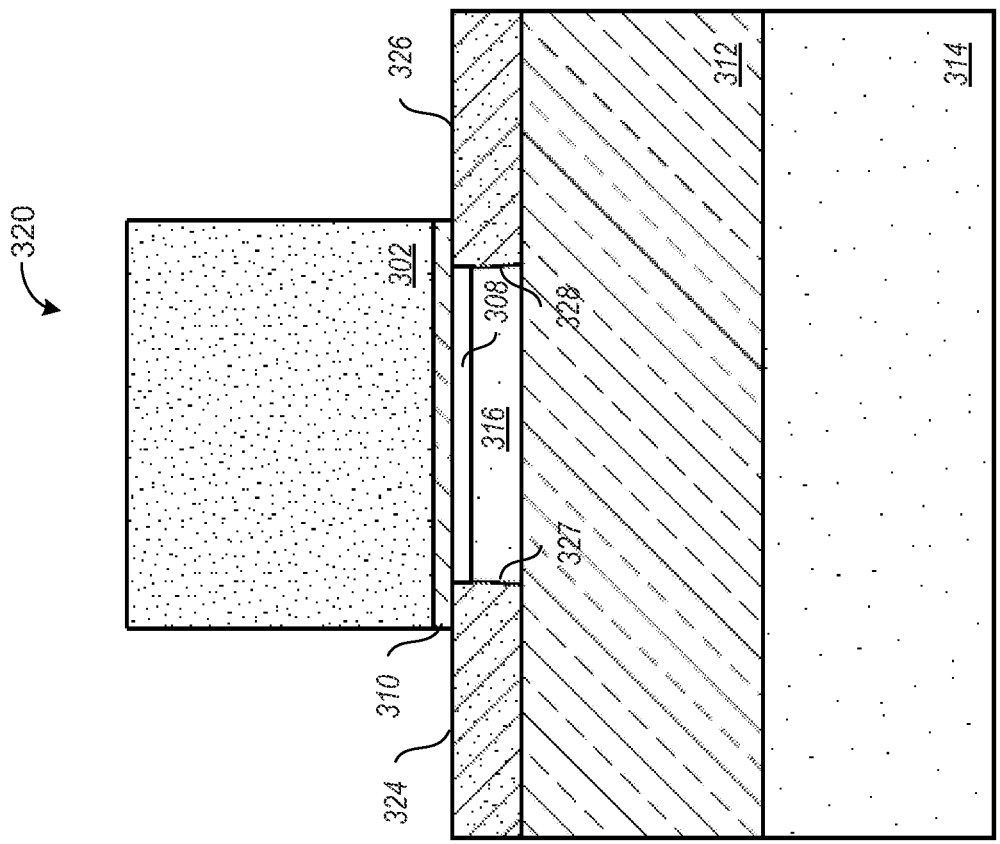
FIG. 3B is a cross-sectional diagram of a fully-depleted silicon-on-insulator (FDSOI) transistor.
Figure 3A:
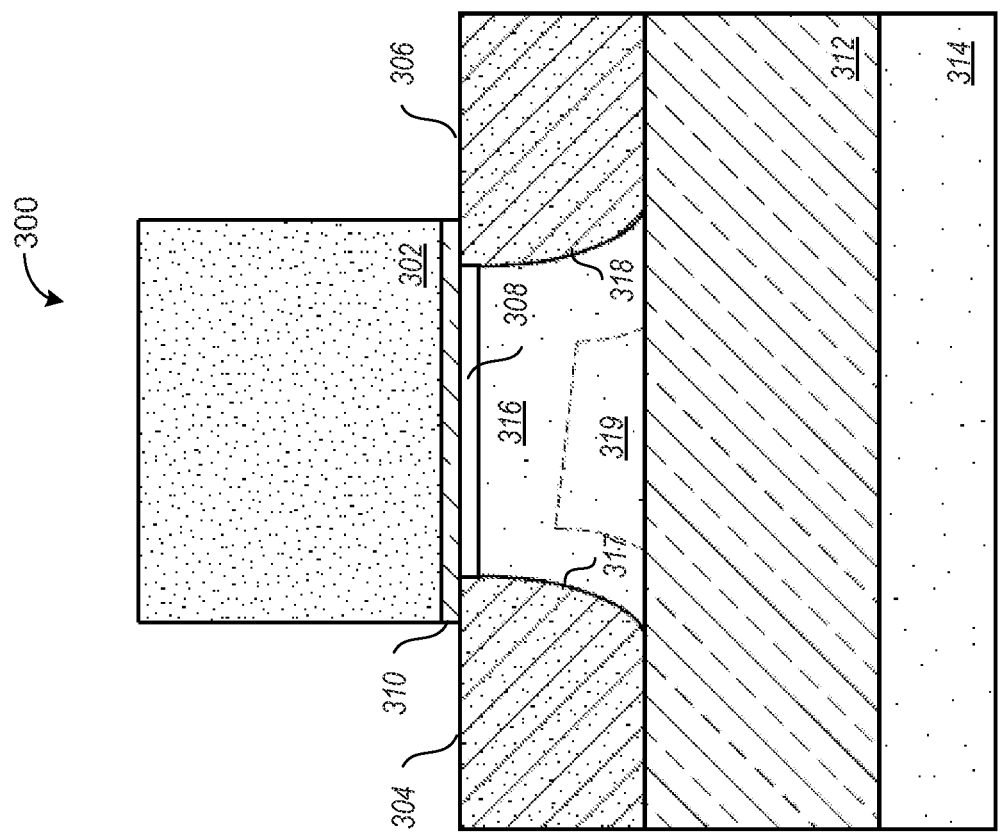
FIG. 3A is a cross-sectional diagram of a partially-depleted silicon-on-insulator (PDSOI) transistor.

FIGS. 3A and 3B provide general information about silicon-on-insulator (SOI) transistors, familiar to those skilled in the art of transistor design. FIG. 3A shows a partially-depleted MOS SOI transistor 300 in cross section. Like standard bulk MOS transistors, the SOI transistor 300 is a three-terminal device in which a voltage applied to a gate 302 causes current to flow from a source 304 to a drain 306 through a channel 308. The gate 302 is separated from the rest of the device by a thin capacitive gate oxide layer 310. The SOI transistor 300 differs from a bulk MOS transistor in that there exists a buried oxide (BOX) layer 312 between the channel region 308 and a bulk silicon substrate 314. A depletion region 316, depleted of charge, that forms below the channel 308, between the source and drain regions 304 and 306, is then bounded below by the BOX 312. The presence of the BOX prevents the substrate voltage from electrically influencing the channel 308. Otherwise, the extent of the depletion region depends on the relative dimensions of the various layers, as well as source and drain doping profiles, 317 and 318, respectively, and doping concentrations of the source and drain regions. In the case of the partially-depleted SOI device shown in FIG. 3A, the depletion region 316 does not fill all of the material between the source and the drain, wherein an un-depleted portion 319 remains at an undetermined floating electric potential. The presence of the un-depleted portion 319 is generally undesirable because it is not well controlled, and yet the associated floating electric potential can electrically influence the channel and degrade the transistor performance.

A fully-depleted SOI (FDSOI) transistor 320 is shown in FIG. 3B in cross section. Like the partially-depleted SOI transistor 300 shown in FIG. 3A, the FDSOI transistor 320 also has a BOX layer 312. However, the source and drain regions of the FDSOI device, 324 and 326 respectively, are shallower than the source and drain regions 304 and 306 of the PDSOI device 300. As a result, doping profiles 327 and 328 are effectively vertical, and the charge characteristics of the channel can be set by the doping concentrations such that a fully charge-depleted region 316 forms between the shallow source and drain regions 324 and 326, bounded below by the BOX 312, in response to application of a bias voltage to the gate 302. Because all of the material between the source and drain is charge-depleted, the un-depleted portion 319 shown in FIG. 3A has been eliminated as a possible cause of transistor degradation.

Figure 4:
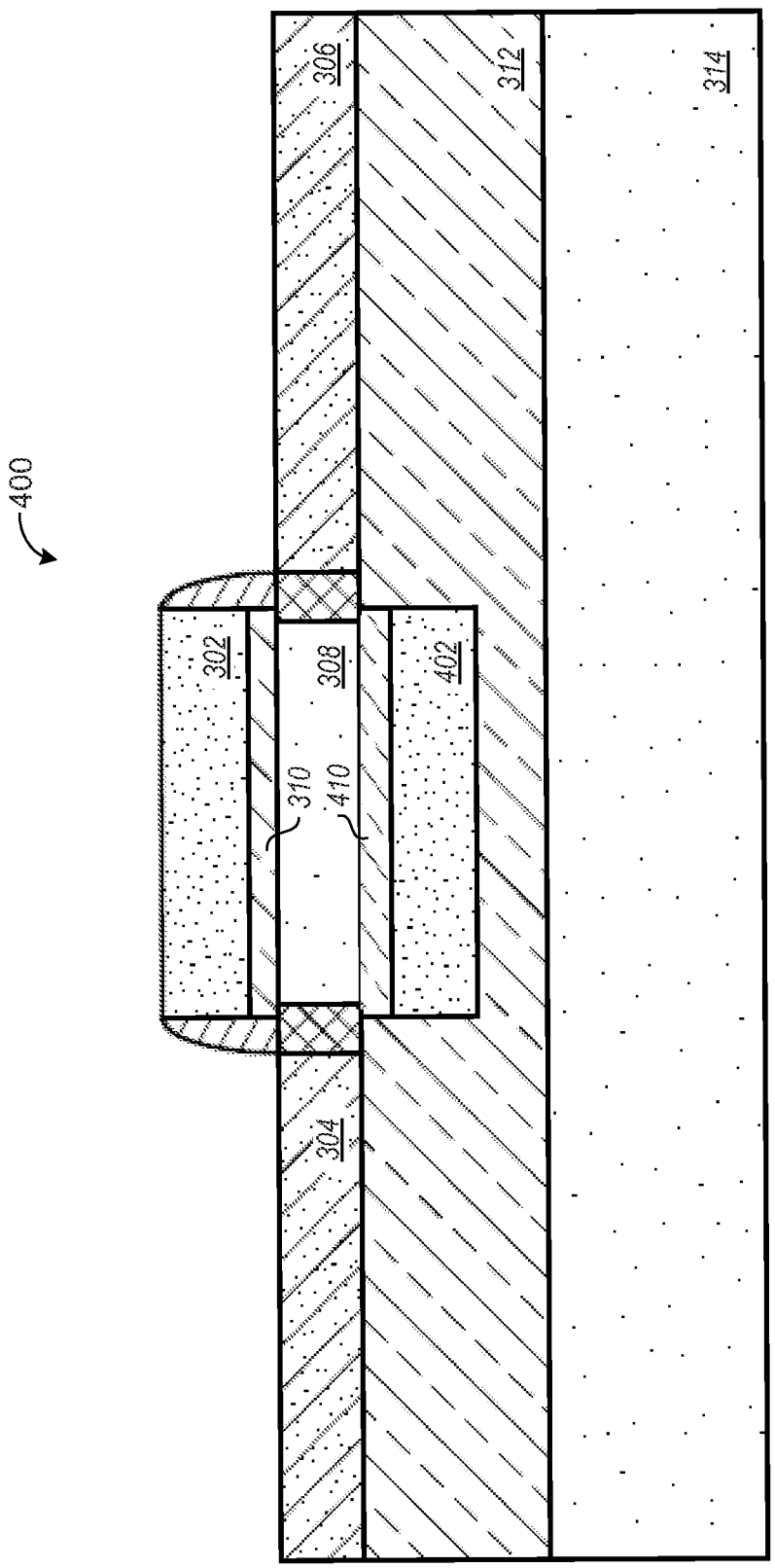
FIG. 4 is a cross-sectional diagram of a dual-gate transistor.

FIG. 4 shows a generalized example of the architecture of an exemplary dual-gate SOI transistor 400 as shown in U.S. Patent Publication No. 2010/0264492. Like the conventional MOS and SOI devices, the dual-gate SOI transistor 400 has a primary gate 302, a source 304 and a drain 306 on either side of a channel region 308, wherein the primary gate 302 is separated by a thin primary gate oxide layer 310. In addition, the dual-gate SOI transistor 400 includes a secondary gate 402, which is separated from the channel region 308 by a thin, secondary gate oxide layer 410. Both the primary and secondary gates 302 and 402 can be biased so as to influence current flow in the channel region 308.

Figure 5:
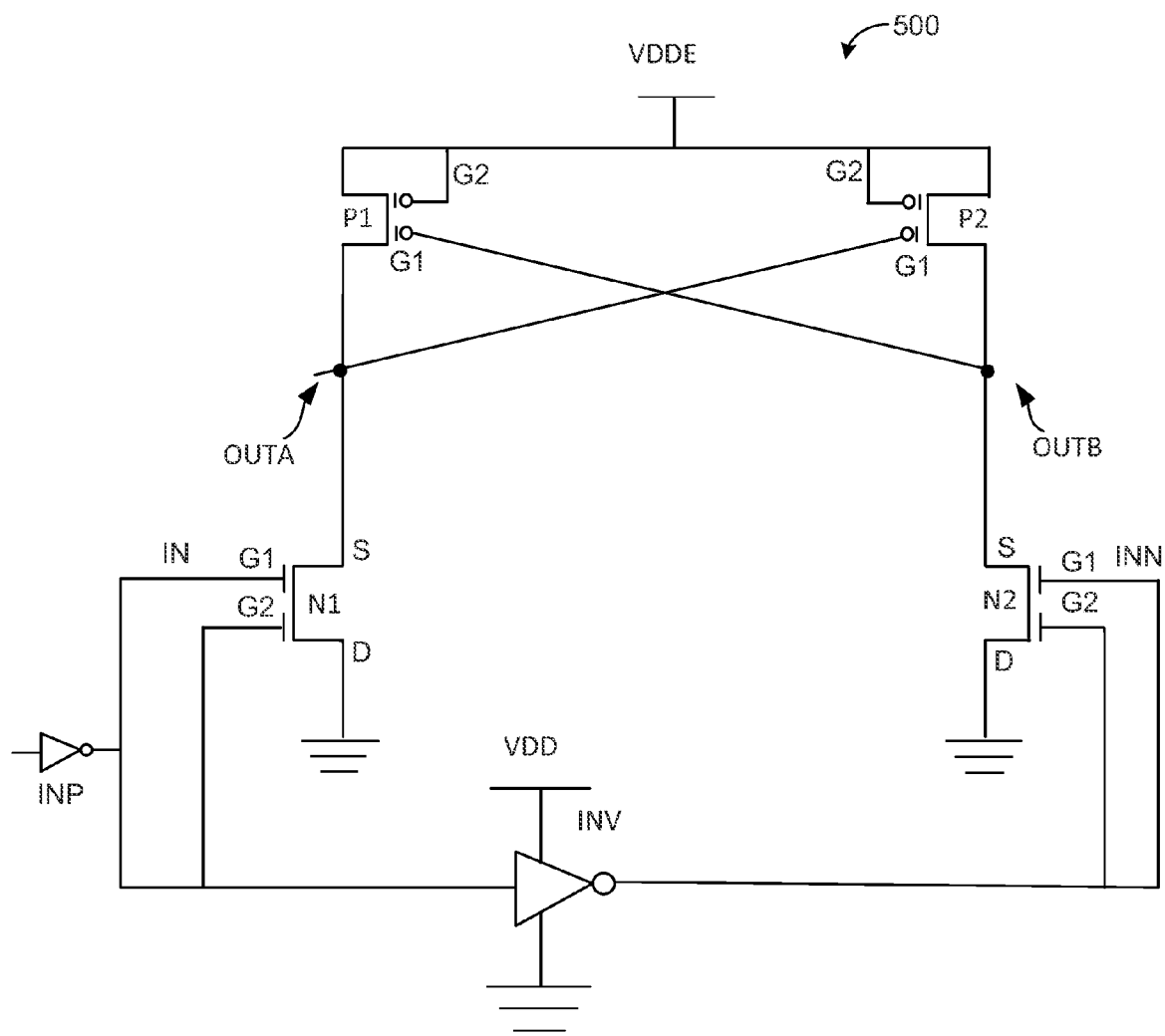
FIG. 5 is a schematic of a level shifter circuit according to one embodiment described herein.

FIG. 5 shows one embodiment of a level shifter circuit 500 that addresses shortcomings of the conventional level shifter circuits 100 and 200, shown in FIGS. 1 and 2, respectively. In the level shifter circuit 500, NMOS transistors N1 and N2 are realized using dual-gate FDSOI devices having short channel widths. Such devices can reach very low threshold voltages, and hence can operate at very low core voltage levels, down to about 0.4 V.

Dual-gate MOS transistors are four-terminal devices having a source S, a drain D, a primary gate G1, and a secondary gate, G2. In the embodiment shown, G1 and G2 of N1 are both coupled to the input of the inverter INV. Likewise, G1 and G2 of N2 are both coupled to the inverted output of the inverter INV. Thus, the secondary gates of each of the NMOS transistors can be thought of as being short-circuited to their respective primary gates. The effect of coupling the primary and secondary gates together is that the secondary gate back-biases the transistor to create an inversion layer in the channel region faster than usual. This causes the threshold voltage to be lower so that the device turns on easier, and the transition time from the low state to the high state is therefore shorter. Because the primary gate is also biased high at the same time, the back-biasing translates to an improvement in the switching performance.

The back-biasing technique can also be used with dual gate bulk transistors as opposed to FDSOI devices. However, the performance of bulk devices is subject to limitations that do not affect FDSOI devices. One such limitation is that the bias is limited to 200-300 mV in bulk technologies. This limitation does not exist in a FDSOI device because the source and drain are fully isolated from the substrate by the buried oxide (BOX). Another limitation that affects bulk transistors is that the effectiveness of a body bias degrades as transistor dimensions shrink in subsequent technology generations. The bias becomes ineffective at about the 20 nm node.

The circuit works in the following manner: when the input INP transitions from low to high, both the primary and secondary gates of N2 are high. The effect of the secondary gate of N2 being high is that the threshold voltage of N2 is lowered. The lower value of $V_t$ allows N2 to turn on faster when the primary gate is energized. Because, in the present configuration, the primary gate of N2, INN, is also high, N2 turns on without hesitation. The rapid turn-on connects OUTB to ground very fast. When OUTB is low, the gate of P1 is high, which turns on P1, thereby pulling OUTA up to a high state at $V_{DDE}$.

Figure 6:
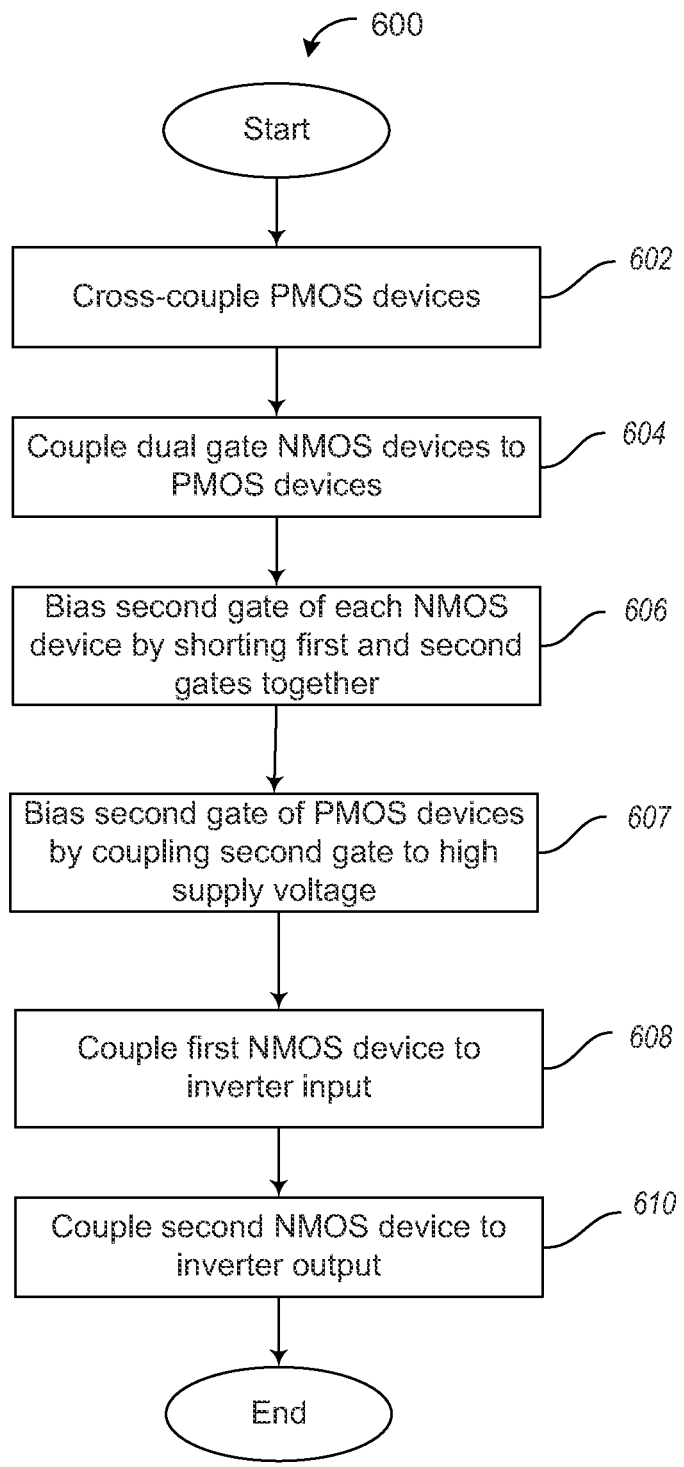
FIG. 6 is a flow diagram showing steps in a method of operating the level shifter circuit shown in FIG. 5.

FIG. 6 shows steps in a method 600 that can be used to operate the level shifter circuit 500, according to one embodiment described herein.

At 602, the PMOS devices P1 and P2 are cross-coupled such that the gate of P2 is coupled through an inverter to the drain of P1 at OUTA, and the gate of P1 is coupled through an inverter to the drain of P2 at OUTB.

At 604, the dual gate NMOS devices N1 and N2 are coupled to the PMOS devices such that the source of N1 is coupled to the drain of P1 at OUTA and the source of N2 is coupled to the drain of P2 at OUTB.

At 606, the primary and secondary gates of each of the NMOS devices are shorted together such that G1 and G2 of N1 are coupled together and G1 and G2 of N2 are coupled together.

At 607, the secondary gates G2 of each of the PMOS devices are coupled to $V_{DDE}$.

At 608, the gates G1 and G2 of N1 are coupled to the input of INV.

At 610, the gates G1 and G2 of N2 are coupled to the output of INV.

In one embodiment, the additional control circuitry including NMOS transistors N7 and N8 can be inserted into the level shifter circuit 500, consistent with the arrangement shown in FIG. 2. Such a circuit configuration further improves the performance of the circuit 200 in a similar way as the circuit 500 provides a performance enhancement to the circuit 100.

Figure 7:
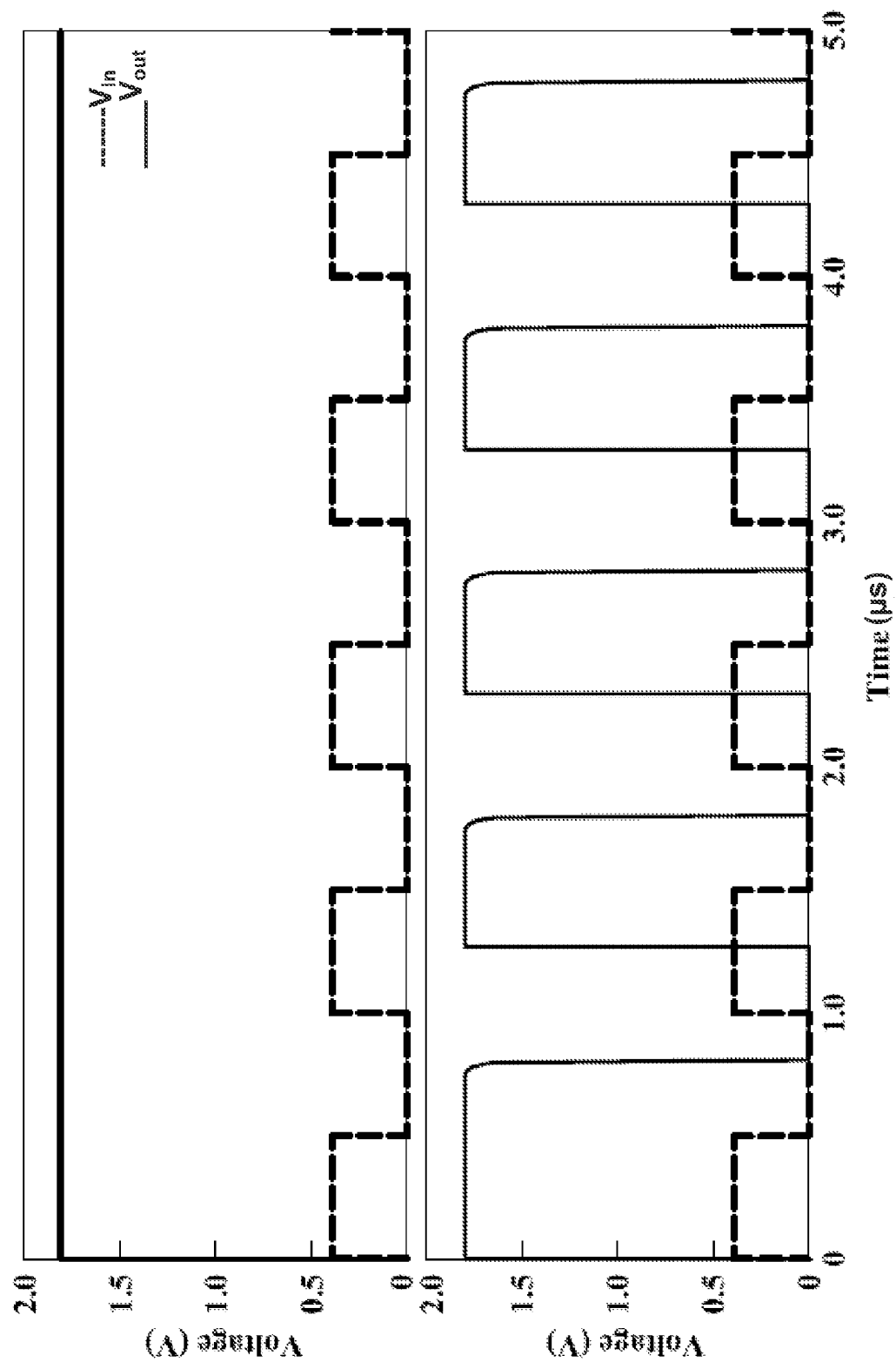
FIG. 7 shows a pair of signals derived from a circuit simulation, comparing performance of the level shifter circuits shown in FIG. 5 and FIG. 1, respectively, when operated at low voltage supply levels.
Figure 8:
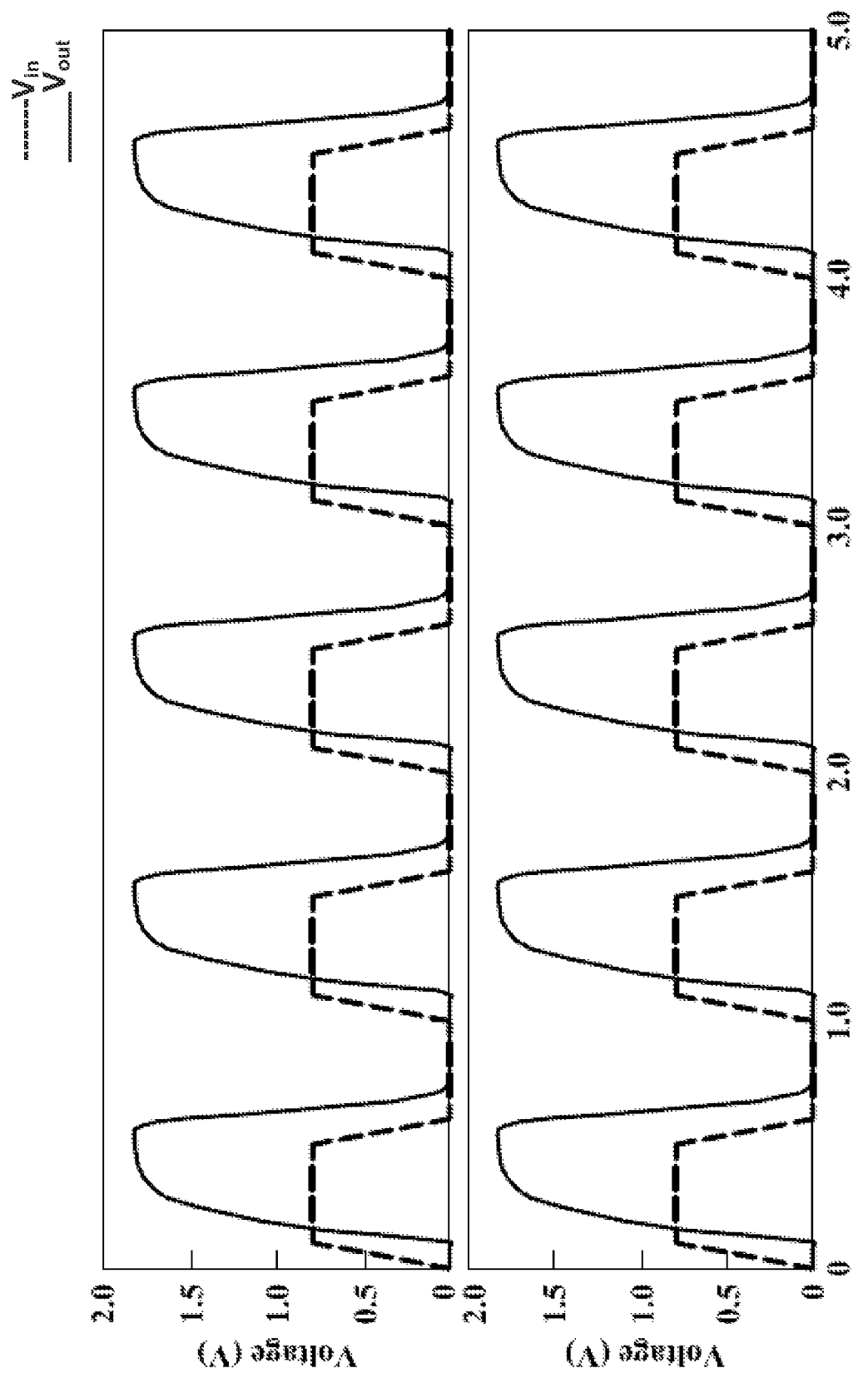
FIG. 8 shows a pair of signals derived from circuit simulations comparing performance of NMOS transistors shown in FIG. 1 with that of NMOS transistors shown in FIG. 5 having narrower channel widths.
Figure 9:
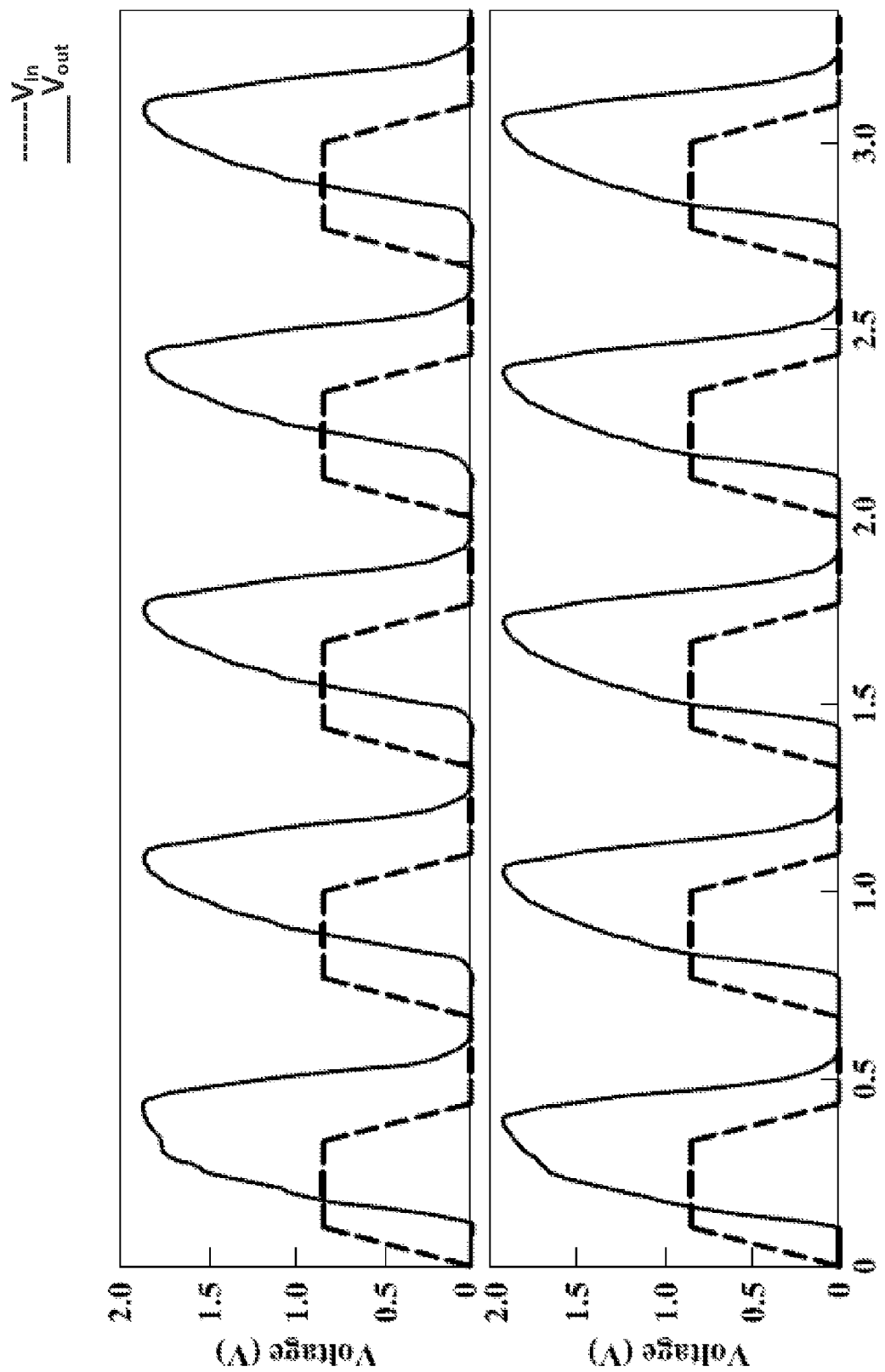
FIG. 9 shows a pair of signals derived from circuit simulations comparing circuit behavior of the level shifter circuits shown in FIG. 5 and FIG. 1, respectively, when operated at high frequency, keeping other parameters the same.

FIGS. 7, 8, and 9 demonstrate advantages of the level shifter circuit 500 by directly comparing circuit simulation results of the level shifter circuit 500 design with those of conventional level shifter circuits. Simulation results were obtained using ELDO circuit simulation software available from Mentor Graphics, Inc. of Wilsonville, Oreg. In each of the plots, the upper curves correspond to the conventional design the level shifter circuit 100, and the lower plots correspond to the improved design used in the level shifter circuit 500.

FIG. 7 illustrates results of a circuit simulation that was run using a square wave input signal at a very low core supply voltage of 0.4 V. The input signal has a period of 1.0 μs, which corresponds to a frequency of 1 MHz. It is observed that the level shifter circuit 100 output signal is shifted to a higher voltage level of 1.8 V, but that it remains at 1.8 V continuously. In contrast, the lower curves show that the improved level shifter circuit 500 output signal is also shifted to 1.8 V, but the level shifter circuit 500 is able to respond to the input signal with only a 0.3 μs delay. At the relatively low frequency of 1 MHz, the level shifter output signal has the desired square wave shape.

FIG. 8 illustrates results of a circuit simulation comparing the conventional level shifter circuit 100 with the inventive level shifter circuit 500. The simulation was run using NMOS transistors having reduced threshold voltages, and corresponding reduced channel widths of 4 μm, as compared with 10 μm channel widths used in the FIG. 7 simulations. This input signal was a modified square wave at a core supply voltage of 0.8 V. In this simulation, the input signal has a period of 1.0 ns, which corresponds to a frequency of 1 GHz, 1000 times faster than that used in the simulation described by FIG. 7. It is observed that the level shifter circuit 100 output signal is shifted to a higher voltage level of 1.8 V, and in this example, the level shifter circuit 100 is capable of tracking the input signal. Thus, the output signal is shown as oscillatory with a delay of only about 0.1 ns because the smaller threshold voltage device is much more responsive. The lower curves show that the improved level shifter circuit 500 output voltage level is also shifted to 1.8 V, and the level shifter circuit 500 is able to respond to the input signal with only a 0.1 ns delay. Thus, shorting the primary and secondary gates together in the level shifter circuit 500 design has resulted in the same performance as is obtained with the conventional level shifter circuit 100, however at smaller NMOS transistor channel widths. Therefore, to achieve the same performance, the level shifter circuit 500 requires less area compared to the area of the conventional level shifter circuit 100, and hence the level shifter circuit 500 is more area efficient.

FIG. 9 illustrates results of a circuit simulation comparing the conventional level shifter circuit 100 with the inventive level shifter circuit 500. The simulation was run using NMOS transistors operated at high frequency. The input signal was a modified square wave at a core supply voltage of 0.8 V. In this simulation, the input signal has a period of about 0.67 ns, which corresponds to a frequency of 1.5 GHz, 50% faster than the simulation described by FIG. 8. It is observed that the level shifter circuit 100 output signal is shifted to a higher voltage level of 1.8 V, and in this example, the level shifter circuit 100 is capable of tracking the input signal, but the output signal is not a perfect square wave. Instead, the output signal has a more sinusoidal shape. The delay of the output signal relative to the input signal is about 0.12 ns.

The lower curves show that the improved level shifter circuit 500 output is also shifted to 1.8 V, and the level shifter circuit 500 output signal is also more sinusoidal in shape. However, the level shifter 500 circuit is able to respond to the input signal with only about a 0.1 ns delay. Thus, shorting the primary and secondary gates together in the level shifter circuit 500 design at an operating frequency of 1.5 GHz results in about a 20% performance improvement in switching delay over the conventional level shifter circuit 100. In addition, the on-off transition from the logic 1 state to the logic 0 state is also about 20% faster than the corresponding transition of the level shifter 100 circuit output signal.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
first and second p-channel fully depleted silicon on insulator (FDSOI) devices electrically cross-coupled to one another through an inverter to form a level shifter that shifts a low supply voltage to a high supply voltage, each p-channel FDSOI device including a primary gate and a secondary gate, the secondary gates of the p-FDSOI device being coupled to the high supply voltage;
first and second dual-gate n-channel FDSOI devices, each dual-gate n-channel FDSOI device including a primary gate and a secondary gate, the primary and secondary gates of each n-channel FDSOI device being electrically coupled to one another, and each n-channel device coupled to a corresponding one of the p-channel devices; and
an inverter having an input and an inverted output, the input electrically coupled to the primary and the secondary gates of the first n-channel device, and the inverted output electrically coupled to the primary and the secondary gates of the second n-channel device.

2. The circuit of claim 1 wherein the dual-gate n-channel devices each have a channel length within a range of 1-10 μm.

3. The circuit of claim 1 wherein the dual-gate n-channel devices have threshold voltages within a range of 0.4-0.6 V.

4. The circuit of claim 1 wherein the p-channel devices are PMOS transistors.

5. The circuit of claim 1 wherein the n-channel devices are NMOS transistors.

6. A method of operating a level shifter circuit, the method comprising:
cross-coupling first and second dual gate p-channel devices to one another;
coupling first and second dual gate n-channel devices to corresponding ones of the p-channel devices;

biasing a secondary gate of each of the n-channel devices by coupling the secondary gate to a primary gate;

biasing a secondary gate of each of the p-channel devices by coupling the secondary gate to a high voltage supply;

coupling the first n-channel device to an input of an inverter; and coupling the second n-channel device to an output of the inverter.

7. The method of claim 6 wherein a high logic state of the inverter is set at a low voltage level suitable for core integrated circuit functions.

8. The method of claim 7 wherein the low voltage level suitable for core functions is within a range of about 0.6 V-1.1 V.

9. The method of claim 6 wherein a high logic state of each of the p-channel devices is set at a high voltage level suitable for I/O functions.

10. The method of claim 9 wherein the high voltage level suitable for I/O functions is within a range of 1.65 V-3.6 V.

11. The method of claim 6 wherein operating the level shifter circuit entails applying an input signal having a frequency less than about 2.0 GHz.

12. A level shifter circuit, comprising:

two or more dual gate PMOS FD-SOI transistors each having a first gate coupled to a high supply voltage;

two or more dual gate NMOS FD-SOI transistors including primary and secondary gates that are coupled together, the NMOS FD-SOI transistors cross-coupled to second gates of the PMOS FD-SOI transistors; and one or more inverters coupled to a low supply voltage and to the NMOS FD-SOI transistors, such that a high voltage output signal is produced in response to a low voltage input signal.

13. The level shifter circuit of claim 12 wherein the high voltage output signal level is at least three times greater than the low voltage input signal level.

14. The level shifter circuit of claim 12, further comprising control circuitry including a pair of NMOS transistors coupled between the dual gate NMOS FD-SOI transistors and the dual gate PMOS FD-SOI transistors, the gates of the NMOS FD-SOI transistors coupled to a reference voltage.

\* \* \* \* \*